US006707356B2

(12) United States Patent
Freeman

(10) Patent No.: US 6,707,356 B2
(45) Date of Patent: Mar. 16, 2004

(54) METHOD OF CONSTRUCTING A RELAY

(75) Inventor: James A Freeman, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/464,378

(22) Filed: Jun. 18, 2003

(65) Prior Publication Data

US 2003/0218523 A1 Nov. 27, 2003

Related U.S. Application Data

(62) Division of application No. 09/841,928, filed on Apr. 24, 2001, now Pat. No. 6,621,391.

(51) Int. Cl.[7] ........................ H01H 51/22; H03H 7/24

(52) U.S. Cl. ........................ 335/78; 335/4; 335/80; 335/83; 333/81 R

(58) Field of Search ........................ 335/4, 78, 80, 335/83; 333/81 R

(56) References Cited

U.S. PATENT DOCUMENTS

| | | | |
|---|---|---|---|
| 3,019,402 | A | 1/1962 | Lanctot |
| 3,319,194 | A | 5/1967 | Adam |
| 3,518,588 | A | 6/1970 | Norton, Jr. |
| 3,626,352 | A | 12/1971 | McCoig |
| 3,753,170 | A | 8/1973 | Holland |
| 3,828,286 | A | 8/1974 | Bain |
| 4,008,447 | A | 2/1977 | Anderson et al. |
| 4,019,165 | A | 4/1977 | Wright |
| 4,021,631 | A | 5/1977 | Sprando |
| 4,260,965 | A | 4/1981 | Nakamura et al. |
| 4,475,095 | A | 10/1984 | Brown |
| 4,496,919 | A | 1/1985 | Fournier et al. |
| 4,595,893 | A | 6/1986 | Charbonnier et al. |
| 4,795,960 | A | 1/1989 | Malcolm |
| 4,949,061 | A | 8/1990 | Kirma |
| 5,061,909 | A | 10/1991 | Hjipieris et al. |
| 5,315,273 | A | 5/1994 | Blair et al. |
| 5,894,255 | A | 4/1999 | Wallintin |
| 6,211,756 | B1 | 4/2001 | Sun et al. |

*Primary Examiner*—Ramon M. Barrera

(57) ABSTRACT

An electro-mechanical relay including a substrate. A pass through circuit may be mounted on a first face of the substrate. An attenuator circuit may be mounted on a second face of the substrate. An armature assembly may be provided that is movable between first and second positions with respect to the substrate. The armature assembly when moved to its first position causes the pass through circuit to be coupled into a circuit. When moved to its second position, the armature assembly causes the attenuator circuit to be coupled into a circuit.

5 Claims, 11 Drawing Sheets

METHOD OF CONSTRUCTING A RELAY

This is a Divisional of copending application Ser. No. 09/841,928, filed on Apr. 24, 2001, now U.S. Pat. No. 6,621,391 the entire disclosure of which is incorporated herein by reference.

FIELD OF THE INVENTION

The invention pertains to electro-mechanical relays of the type which alternately allow current to flow through one of two or more circuits.

BACKGROUND OF THE INVENTION

One way to close a circuit connection is by way of an electro-mechanical relay. In its simplest form, a relay merely makes or breaks a single circuit connection (i.e., it opens or closes a path through which current may flow). Depending on the relay's intended use, a biased conductor which makes the circuit connection is biased so that the connection is "normally open" or "normally closed". An armature which is movable between first and second positions then presses on the biased conductor when the armature is moved to one of its positions, and the pressing on the biased conductor causes the biased conductor to move from its biased state. In this manner, a normally open connection may be closed, and a normally closed connection may be opened. Movement of the armature is controlled by an electro-magnetic actuator assembly. Typically, the actuator assembly will comprise a magnetic core encircled by an electric coil. The ends of the coil are coupled to a control circuit. When the control circuit is closed, current flows through the coil and causes the magnetic core to exert an attractive or repelling force which causes a relay's armature to move out of its biased position. When the control circuit is opened, current ceases to flow through the coil and the magnetic force exerted by the core ceases to exist. Opening the control circuit therefore allows a relay's armature to return to its biased position. While the movement of an armature is typically rotational (e.g., the armature is mounted within a relay using pins which lie on the armature's rotational axis), the movement of an armature is sometimes translational (e.g., the armature is mounted so that it travels along a track).

While some simple relays comprise only a single circuit, and therefore a single current path which may be opened or closed, other relays comprise two or more circuits through which current may alternately flow, depending on which of the two or more circuits is currently closed. In some relays, two alternate circuit paths will comprise a pass-through circuit path and an attenuated circuit path. The pass-through circuit path simply allows electrical signals to flow through the relay without attenuation. On the other hand, and as its name implies, the attenuated circuit path attenuates electrical signals which flow through the relay.

With advances in manufacturing technology, electronic devices have become increasingly smaller. As a result, the size of electro-mechanical relays has decreased. However, as pass-through and attenuator circuits are mounted in closer proximity of one another, there is a greater chance that the two circuits will interfere with one another. For example, an electrical signal flowing through an attenuator circuit may receive unwanted attenuation from an open pass-through circuit or vice versa. The open circuit acts as an antenna which receives stray electrical signals and then capacitively transfers the stray signals to the closed circuit. Because this interference may increase as the distance separating the relevant circuits decreases, reducing this interference to a manageable level has become an increasingly important design criterion for miniature relays.

An example of a typical electro-mechanical relay comprising pass-through and attenuator circuits, which is hereby incorporated by reference for all that it discloses, is disclosed in the U.S. Patent of Blair et al. entitled "Attenuator Relay" (U.S. Pat. No. 5,315,273). The relay disclosed by Blair et al. is intended to be housed in a cannister having a volume of approximately 0.05 cubic inches. While such a miniature relay is adequate for some applications, the close proximity of its pass-through and attenuator circuits results in too much noise in other applications.

Consequently, a need exists for an electro-mechanical relay that is capable of alternately opening and closing two or more circuits (e.g., pass-through and attenuator circuits) such that an open one of the circuits does not impart noise to a closed one of the circuits.

SUMMARY OF THE INVENTION

In achievement of the foregoing need, the inventor has devised a new electro-mechanical relay.

In one embodiment of the invention, a relay comprises a substrate, a first circuit mounted on a first face of the substrate, a second circuit mounted on a second face of the substrate, an electro-magnetic actuator assembly, and an armature assembly which is movable between first and second positions with respect to the substrate. Movement of the armature assembly is controlled by the electro-magnetic actuator assembly, and when the armature assembly is moved to its first position, current is allowed to flow through the first circuit. When the armature assembly is moved to its second position, current is allowed to flow through the second circuit. Use of the substrate to separate the two circuits ensures that interference between the two circuits is kept below an adequate level.

The armature assembly can open and close the two circuits in a number of ways. In one relay which is described herein, an armature assembly comprises a number of actuator arms, some of which pass through the substrate. Actuator arms which do and do not pass through the substrate press on a number of spring clips and/or other biased conductors to open and/or close circuits. In another relay described herein, an armature assembly is mounted so that it presses on at least one biased conductor which abuts a substrate. The biased conductor comprises contacts which are suspended both above and below the substrate such that movement of the biased conductor enables it to alternately make contact with a circuit mounted on either of two faces of a substrate.

In some embodiments of the invention, a relay's armature assembly is provided with actuator arms which are used to couple a circuit which is not in use to ground. In this manner, it is even more unlikely that a relay's open circuit(s) will interfere with a relay's closed circuit.

BRIEF DESCRIPTION OF THE DRAWINGS

Illustrative and presently preferred embodiments of the invention are shown in the accompanying drawings, in which.

DETAILED DESCRIPTION OF THE INVENTION

1. In General

Figure 1:
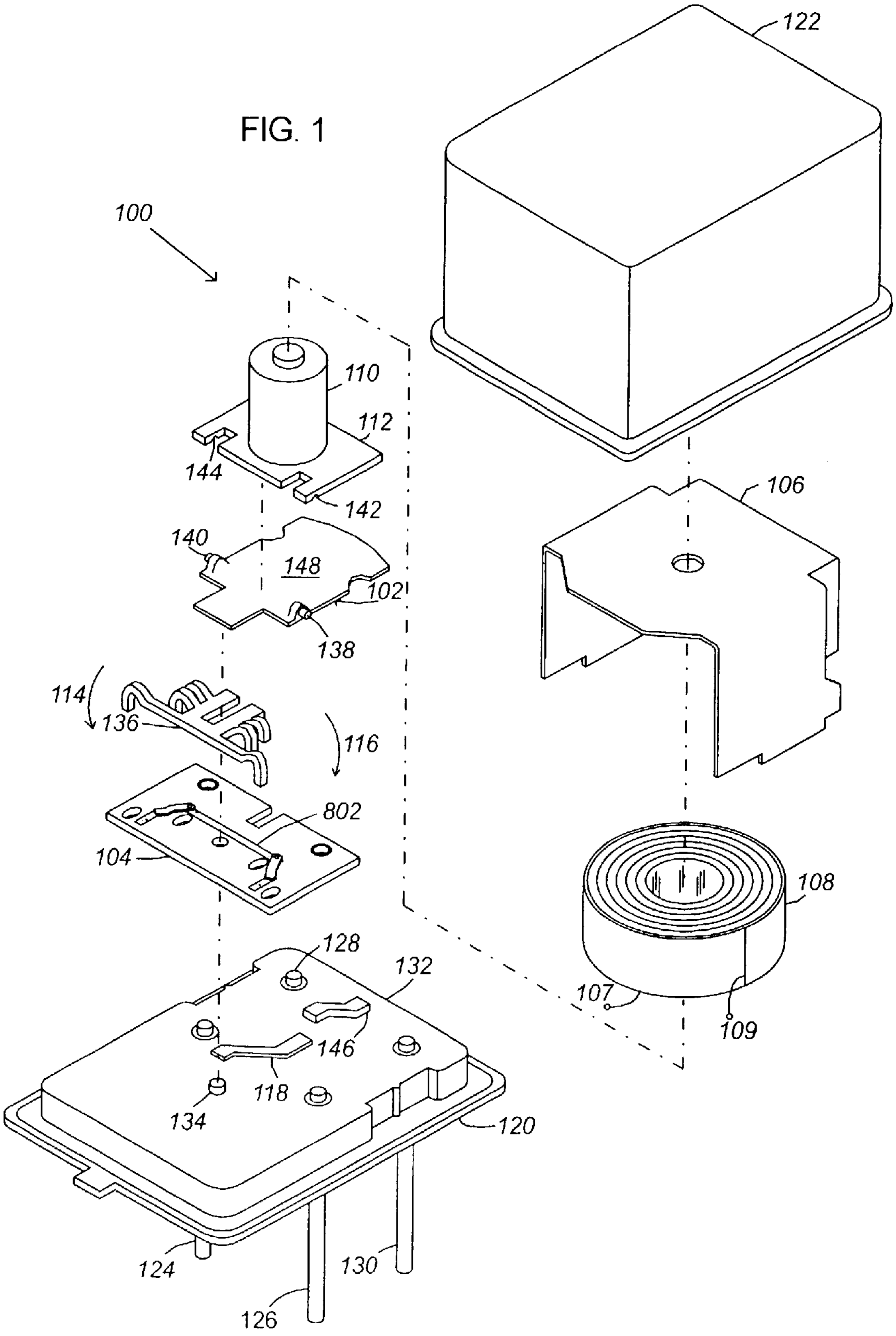
FIG. 1 is a perspective view of a first relay embodiment.
Figure 11:
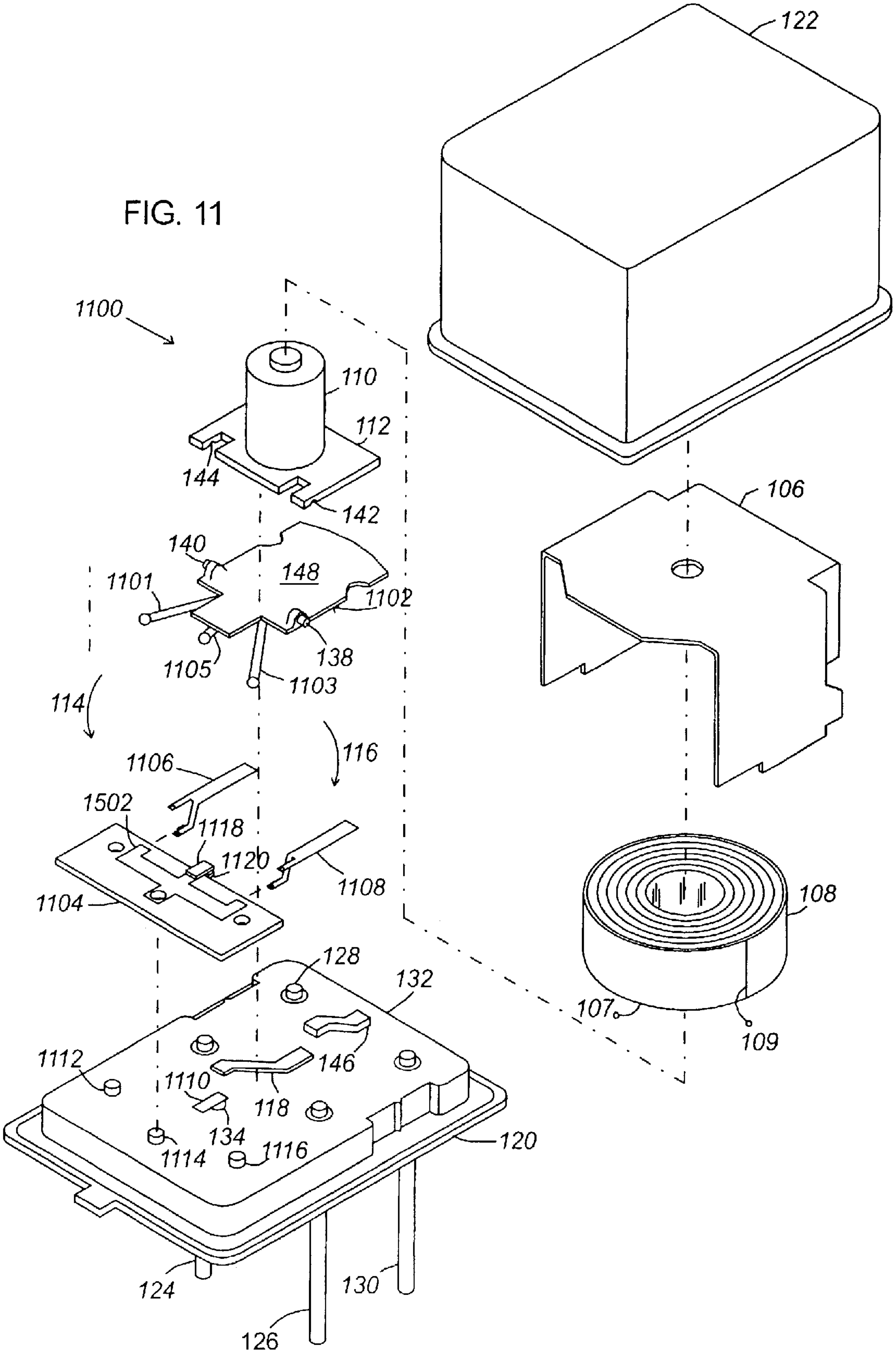
FIG. 11 is a perspective view of a second relay embodiment.
Figure 14:
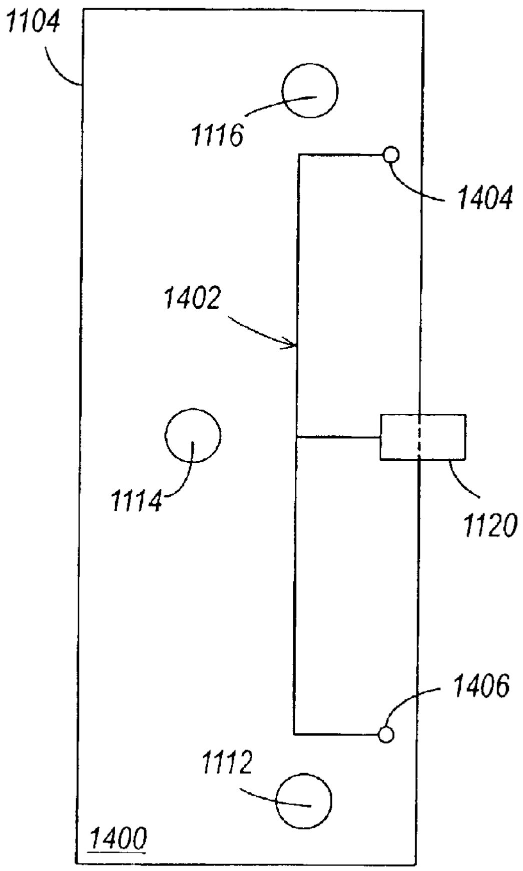
FIG. 14 is a plan view of the first face of the FIG. 11 substrate.
Figure 15:
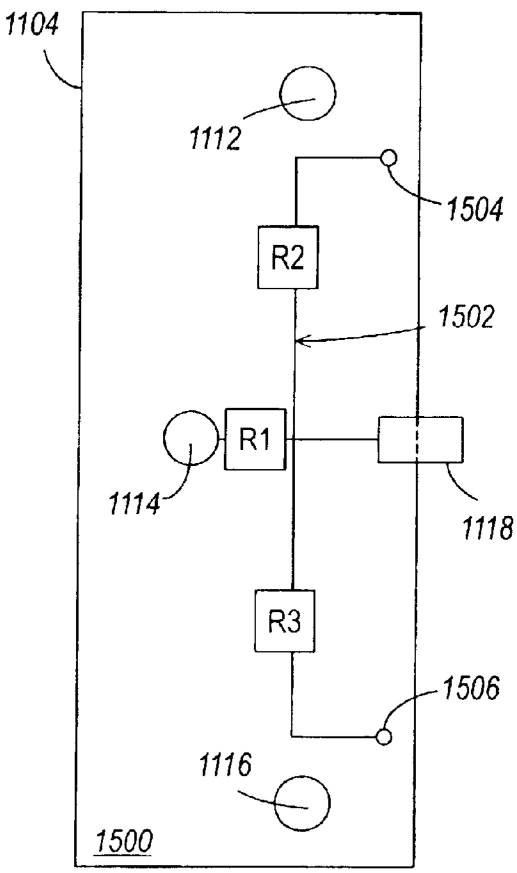
FIG. 15 is a plan view of the second face of the FIG. 11 substrate.

FIGS. 1 and 11 respectively illustrate first and second embodiments 100, 1100 of a relay. Common to both embodiments 100, 1100 is an armature assembly 102, 1102 which is movable between first and second positions with respect to a substrate 104, 1104 on which first 602, 1402 and second 802, 1502 circuits are mounted. In each embodiment 100, 1100, the first circuit 602, 1402 is mounted on a first face 600, 1400 (FIGS. 6, 14) of the substrate 104, 1104, and the second circuit 802, 1502 (FIGS. 8, 15) is mounted on a second face 800, 1500 of the substrate 104, 1104. By way of example, each embodiment 100, 1100 1) shows the first 602, 1402 and second 802, 1502 circuits to be mounted on opposite faces of a substrate 104, 1104, 2) shows the first circuit 602, 1402 to be a pass-through circuit, and 3) shows the second circuit 802, 1502 to be an attenuator circuit.

When the armature assembly 102, 1102 of one of the relays is moved to its first position, current is allowed to flow through the relay's first circuit 602, 1402. Likewise, when the armature assembly 102, 1102 of one of the relays is moved to its second position, current is allowed to flow through the relay's second circuit 802, 1502.

A relay's armature assembly 102, 1102 may be mounted for either rotational (pivotal) or translational (up/down or side/side) movement. However, by way of example, the armature assemblies in FIGS. 1 and 11 are shown to be mounted for rotational movement.

In each of FIGS. 1 and 11, an electromagnetic actuator assembly 106, 108, 110, 112 provides the force or forces which are needed to move an armature assembly 102, 1102 between its first and second positions. The electro-magnetic actuator assembly 106–112 may be more or less integrated with the structure of an armature assembly 102, 1102, and FIGS. 1 and 11 only show one preferred embodiment of an electro-magnetic actuator assembly 106–112. In the preferred embodiment of the electro-magnetic actuator assembly 106–112, the assembly's application or withdrawal of a single, attractive magnetic force provides for armature assembly movement. For example, refer to FIG. 1 wherein the electro-magnetic actuator assembly 106–112 comprises a core 110 and coil 108 which are mounted between two magnetic poles 106, 112. When a voltage is applied to the ends 107, 109 of the coil 108, the core 110 causes a magnetic field to be formed between the two magnetic poles 106, 112, and thereby causes an attractive magnetic force to be exerted on one end of the armature assembly 102, thereby causing the armature assembly 102 to rotate in a first direction 114 (i.e., counter-clockwise in FIG. 1). When the voltage is withdrawn from the coil 108, the magnetic field formed between the two magnetic poles 106, 112 dissipates, and a biasing spring 118 returns the armature assembly to its first position (i.e., the armature assembly 102 moves in direction 116).

Other means of moving an armature assembly 102 will be readily apparent to those skilled in the art. For example, an electro-magnetic actuator assembly could be designed to alternately attract and repel one end of an armature assembly 102 (e.g., in response to two different voltages which are applied to the electro-magnetic actuator assembly). An electro-magnetic actuator assembly could also take the form of a solenoid, wherein a plunger pushes and/or pulls one end of an armature assembly 102.

Having briefly discussed some of the features which are common to the relay embodiments 100, 1100 illustrated in FIGS. 1 and 11, each of the relays 100, 1100 will now be described in greater detail.

2. A First Relay Embodiment

FIG. 1 illustrates a first embodiment 100 of a relay. The relay 100 is housed within a metallic structure comprising a base plate 120 and a cover 122. Protruding through the base plate 120 are first and second pairs of conductive terminals 124/126, 128/130, each pair of which is insulated from the metallic base plate 120. The conductive terminals 124, 126 of the first pair are signal terminals, and are alternately coupled to one another via one of two circuits 602, 802 (FIGS. 6, 8) which are housed within the relay 100. The conductive terminals 128, 130 of the second pair are control terminals, and are provided for the purpose of controlling an electro-magnetic actuator assembly 106–112 which is housed within the relay 100. The presence of a voltage on the control terminals 128, 130 determines the state of the electro-magnetic actuator assembly 106–112, which in turn determines which of the two circuits 602, 802 mounted within the relay 100 will be connected between the signal terminals 124, 126.

A header 132 is mounted (e.g., welded) within the relay housing 120, 122 on top of the base plate 120. The header 132 serves to give the relay 100 more rigidity, and is preferably formed of a metallic material which is grounded to the relay housing 120, 122. By way of example, the header 132 may comprise gold plated Kovar.

The four conductive terminals 124–130 protrude through the header 132, and into the interior of the relay housing 120, 122. The terminals 124–130 are insulated from the header 132, preferably by glass beads which form a glass to metal seal between each terminal 124–130 and the Kovar header 132.

A ground terminal 134 is coupled to the header 132 and protrudes into the interior of the relay housing 120, 122.

Figure 2:
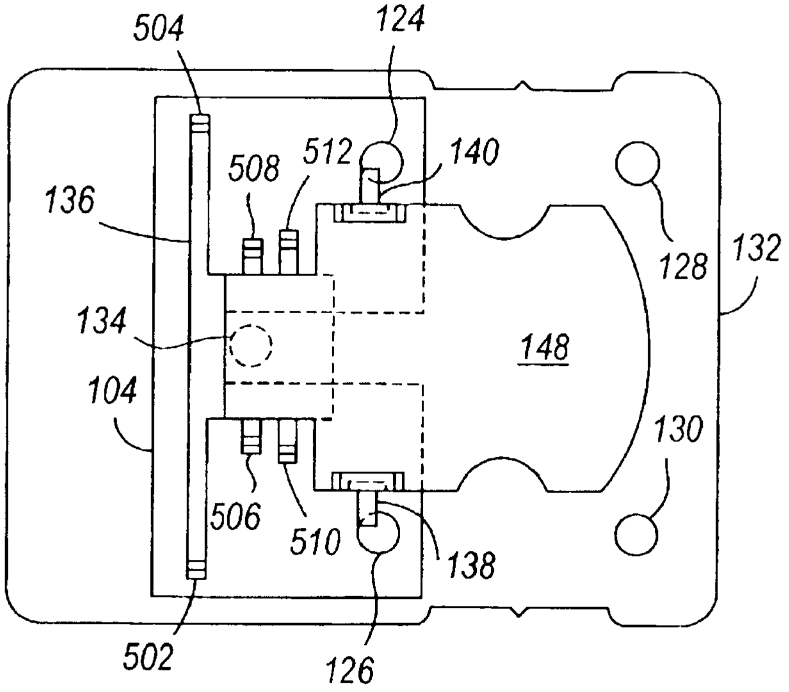
FIG. 2 is a plan view of the armature assembly, substrate and header of the FIG. 1 relay.
Figure 3:
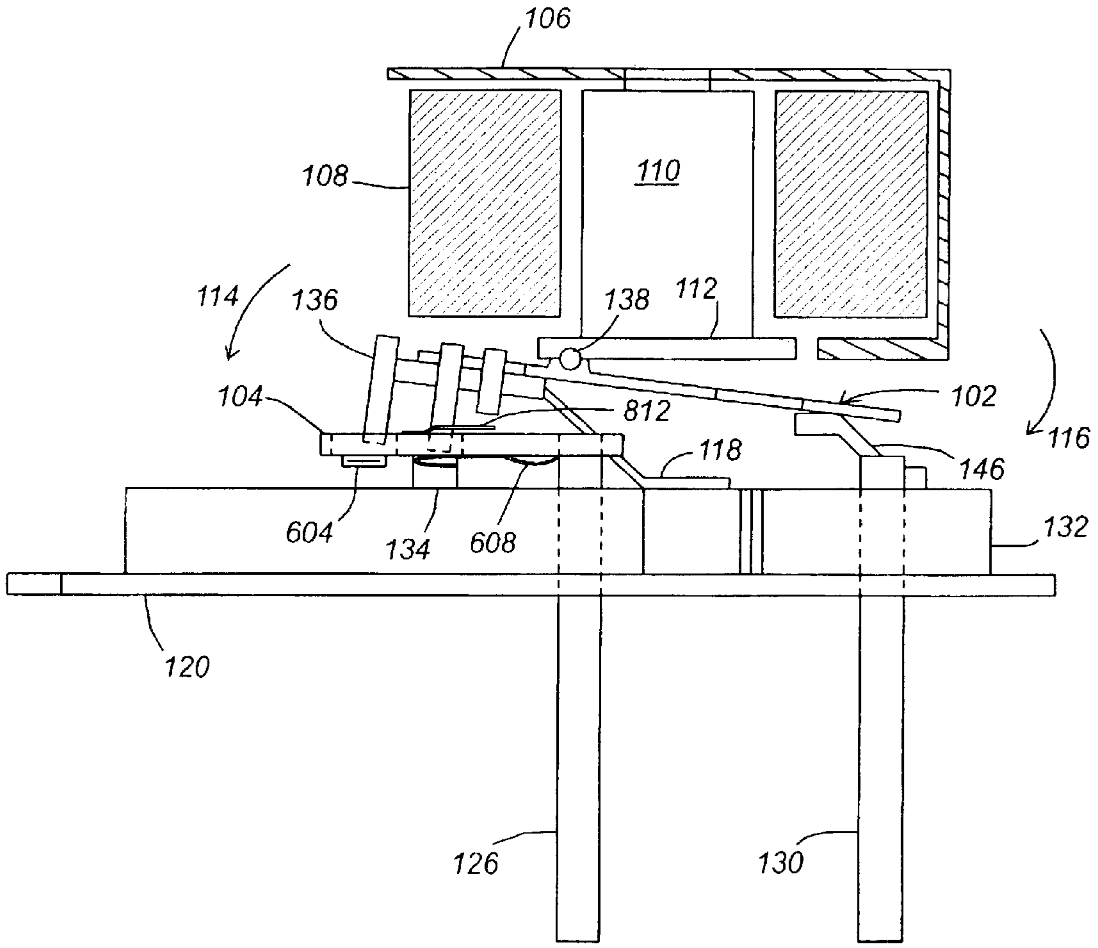
FIG. 3 is an elevational view of the internal components of the FIG. 1 relay.

A substrate 104 (such as a lapped alumina ($Al_2O_3$) ceramic substrate) is suspended above the header 132 (FIGS. 2, 3). Preferably, the substrate 104 is suspended above the header 132 by means of the signal terminals 124, 126 and the ground terminal 134, each of which may protrude through, and be welded to, gold plated holes in the substrate 104.

A pass-through circuit 602 (FIGS. 6, 7) is mounted to the bottom face 600 of the substrate 104, and an attenuator circuit 802 (FIGS. 8, 9) is mounted to the top face 800 of the substrate 104. Various metallic spring clips 604, 606, 812, 814 (or other biased conductors) and metallic pads 620, 622, 626, 628, 816, 818 mounted on the top and bottom surfaces 600, 800 of the substrate 104 serve to alternately couple the pass-through and attenuator circuits 602, 802 between the two signal terminals 124, 126. Additional spring clips 608, 610 mounted on the bottom surface 600 of the substrate 104 serve to ground the attenuator circuit 802 when it is not in use. The various circuits 602, 802, spring clips 604, 606, 608, 610, 812, 814 and metallic pads 620, 622, 626, 628, 816, 818 which are mounted on the substrate 104 will be described in greater detail later in this description.

The electro-magnetic actuator assembly 106–112 which is mounted within the relay housing 120, 122 comprises two magnetic poles 106, 112, a coil 108, and a core 110. The coil 108 is slipped over the core 110, and the core 110 and coil 108 are then mounted between the two magnetic poles 106, 112. The first magnetic pole 106 is then used to mount the electro-magnetic actuator assembly 106–112 to the header 132 such that the second magnetic pole 112 is suspended over the header 132 and in back of the afore-mentioned substrate 104 (which is also suspended over the header 132; see FIG. 3). The two 107, 109 ends of the coil 108 are respectively and electrically coupled to the relay's control terminals 128, 130. When a voltage is applied to the control terminals 128, 130, current flows through the coil 108 and an electromagnetic force flows through the core 110. The electromagnetic force in turn polarizes the two magnetic poles 106, 112 and causes the lower portion of the first magnetic pole to exert an attractive magnetic force on one end of the relay's armature assembly 102.

Figure 4:
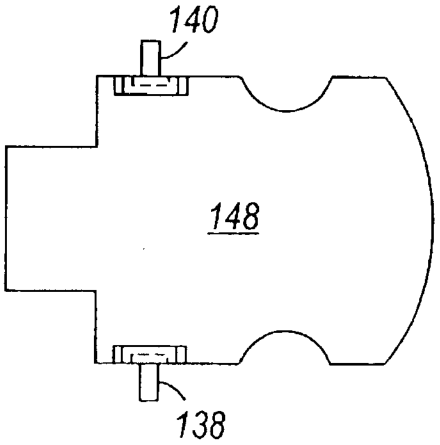
FIG. 4 is a plan view of the main body of the FIG. 1 armature assembly.
Figure 5:
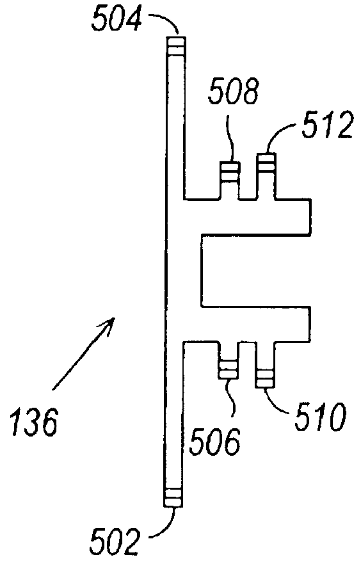
FIG. 5 is a plan view of the actuator arms of the FIG. 1 armature assembly.

The armature assembly 102 comprises a main body 148 (FIGS. 1, 4) and number of actuator arms 136 (FIGS. 1, 5). The main body is an essentially flat metallic structure to which the number of actuator arms 136 and two pivot pins 138, 140 are attached. The actuator arms 136 are preferably formed of a strong, non-conductive material such as plastic. The pivot pins 138, 140 may fit into indents 142, 144, holes or crevices formed in the underside of the second magnetic pole 112. A biasing spring 118 which is mounted on the header 132 applies pressure to the underside of the armature assembly 102 so that the armature assembly 102 assumes its first position when the electro-magnetic actuator assembly 106–112 is not energized. A stop 146 mounted on the header 132 prevents the spring 118 from over-biasing the armature assembly 102. Other means of biasing the armature assembly 102 are contemplated, but not preferred. For example, the electro-magnetic actuator assembly 106–112 could bias the armature assembly 102 to its first position by repelling it, and then move the armature assembly 102 to its second position by attracting it. Or for example, the armature assembly 102 could be biased to its first position via an unequal weight distribution.

The actuator arms 136 which extend from the armature assembly 102 are positioned over various spring clips 604, 606, 608, 610, 812, 814 which are mounted on the substrate 104. First and second pairs of actuator arms 502/504, 506/508 (FIG. 5) are positioned over holes 804, 806, 808, 810 (FIGS. 8 & 9) in the substrate 104, and when the armature assembly 102 is moved to its second position by the electro-magnetic actuator assembly 106–112, the actuator arms 502–508 extend through the substrate 104 to press on spring clips 604, 606, 608, 610 (FIGS. 6 & 7) which are mounted on the underside 600 of the substrate 104.

When the armature assembly 102 is moved to its second position, the actuator arms 136 perform the following functions:

The first pair of actuator arms 502, 504 press on spring clips 604, 606 which are 1) coupled to the pass-through circuit 602, and 2) biased to make contact with conductors 612, 614 which are coupled to the relay's signal terminals 124, 126 (i.e., when the armature assembly 102 assumes its first position, the spring clips 604, 606 couple the pass-through circuit 602 between the relay's signal terminals 124, 126, and when the first pair of actuator arms 502, 504 press on the spring clips 604, 606, their contact with the conductors 612, 614 which are coupled to the relay's signal terminals 124, 126 is broken). Note that when the spring clips 604, 606 are depressed, they may be designed to make contact with the header 132 so as to ground the pass-through circuit 602. See FIGS. 3, 6 & 7.

The second pair of actuator arms 506, 508 press on spring clips 608, 610 which are normally biased to contact and ground the attenuator circuit 802 (i.e., when the armature assembly 102 assumes its first position, the spring clips 608, 610 ground the attenuator circuit 802, and when the second pair of actuator arms 506, 508 press on the spring clips 608, 610, their contact with the attenuator circuit 802 is broken). When the spring clips 608, 610 assume their normally biased positions, they make contact with the attenuator circuit 802 by means of conductive vias 630, 632 which pass through the substrate 104. The spring clips 608, 610 are welded to a ground plane 624 which preferably covers most of the substrate's bottom face 600. See FIGS. 3, 6 & 7.

The third pair of actuator arms 510, 512 press on spring clips 812, 814 which are normally biased to an open position. As a result, downward movement 114 of the third pair of actuator arms 510, 512 serves to connect the attenuator circuit 802 between the relay's signal terminals 124, 126 (i.e., when the armature assembly 102 assumes its first position, no current flows through the spring clips 812, 814, and when the third pair of actuator arms 510, 512 press on the spring clips 812, 814, the attenuator circuit 802 is coupled between the relay's signal terminals 124, 126 so that current flows therethrough). Note that the third pair of actuator arms 510, 512 do not pass through the substrate 104. Also note that the weld pads 616, 618 found on the top face 800 of the substrate 104 are coupled to the relay's signal terminals 124, 126 by means of conductive vias 616, 618 which pass through the substrate 104 and couple the weld pads 616, 618 to conductors 612, 614. See FIGS. 3 & 6–9.

Figure 6:
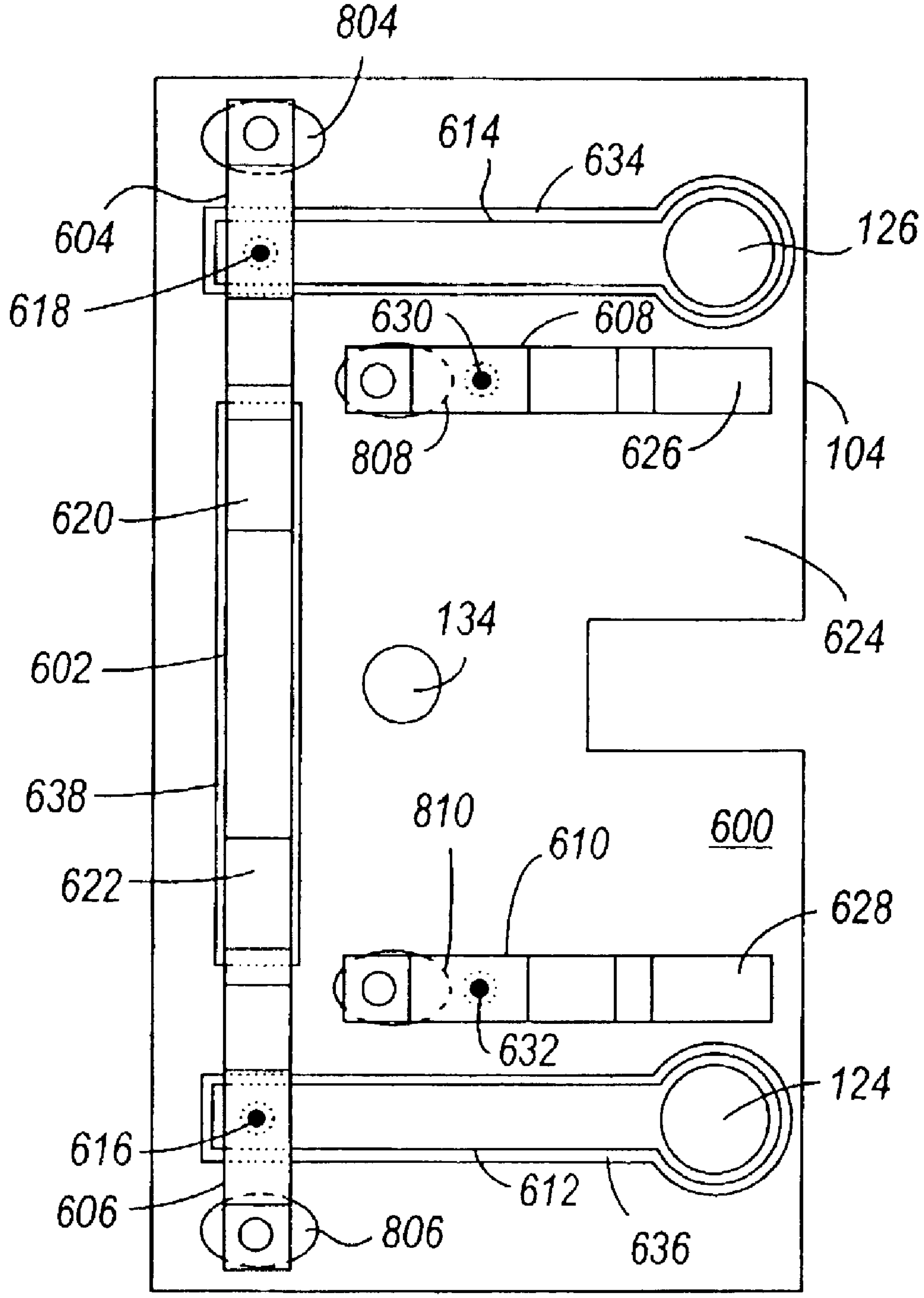
FIG. 6 is a plan view of the first face of the FIG. 1 substrate.
Figure 7:
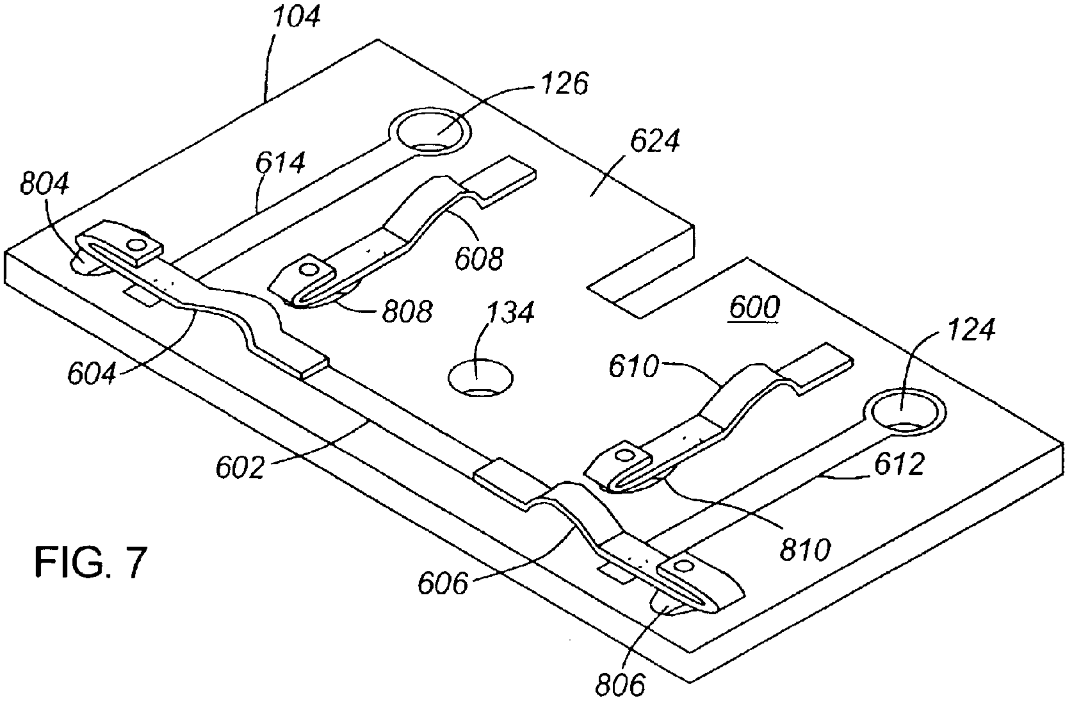
FIG. 7 is a perspective view of the first face of the FIG. 1 substrate.
Figure 9:
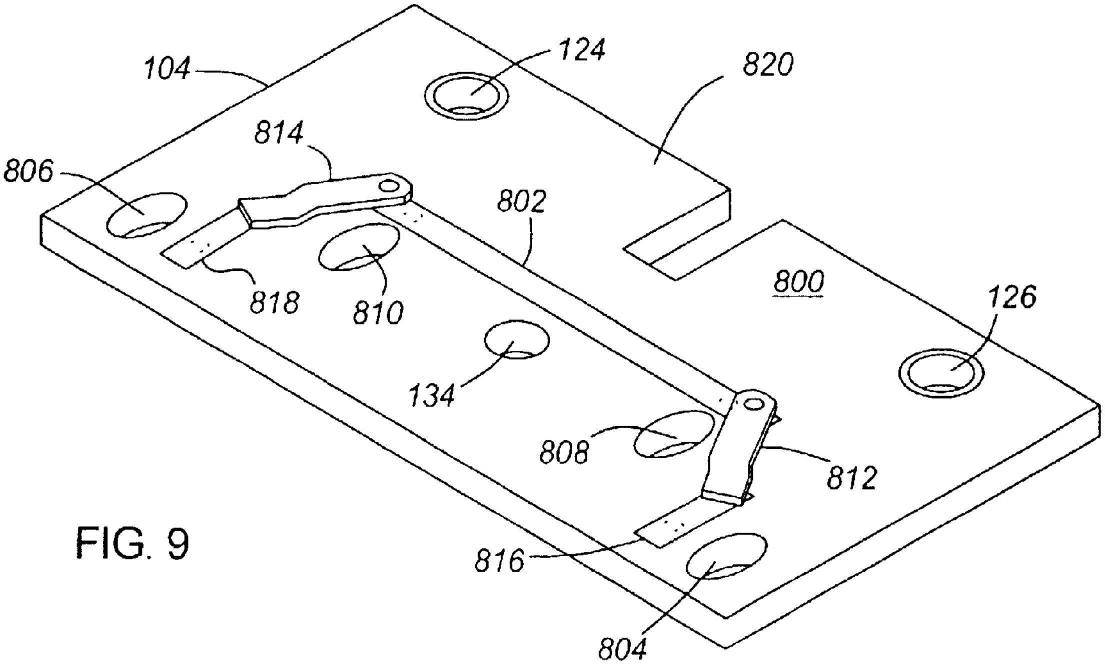
FIG. 9 is a perspective view of the second face of the FIG. 1 substrate.
Figure 8:
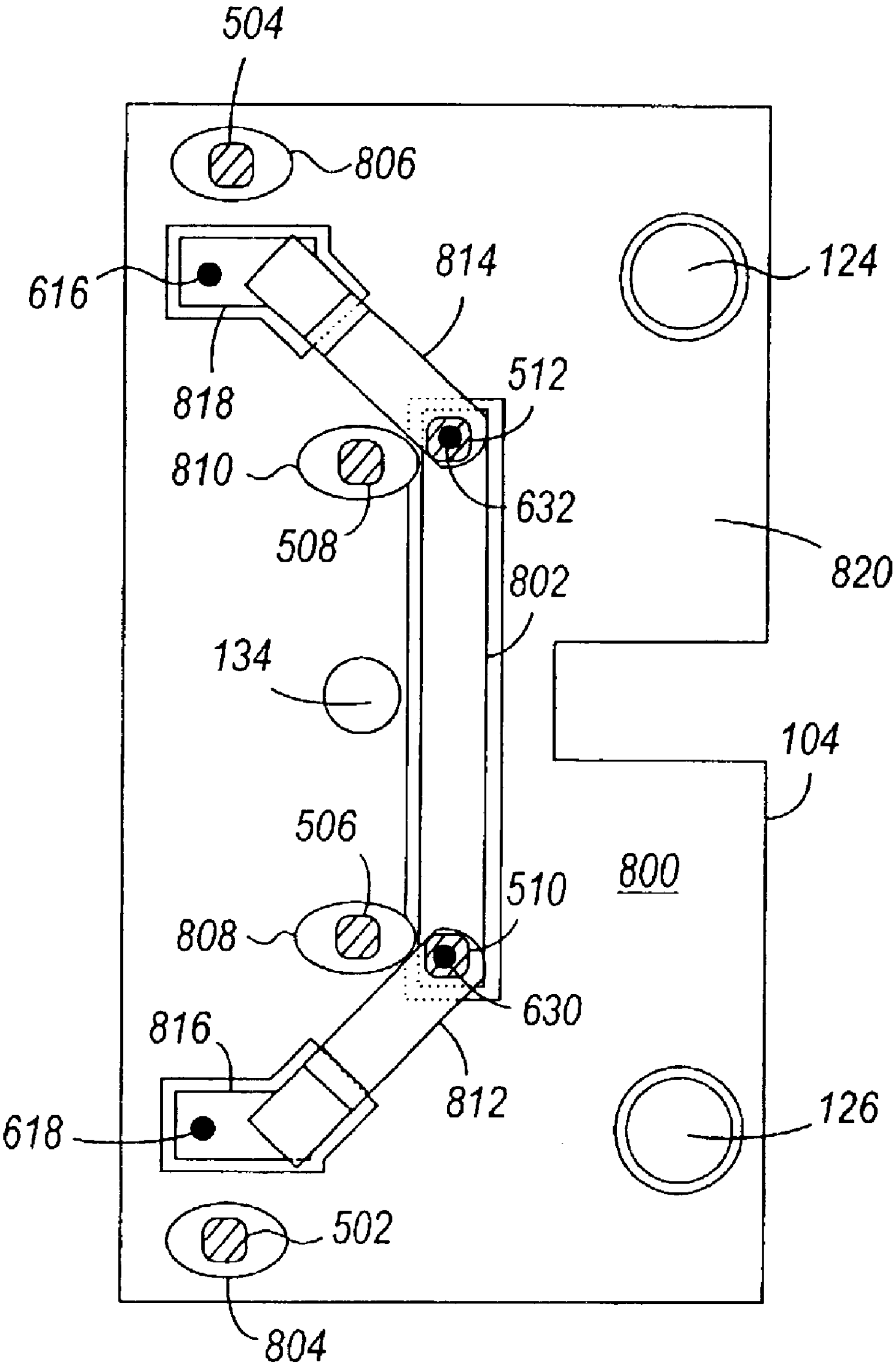
FIG. 8 is a plan view of the second face of the FIG. 1 substrate.

As previously mentioned, a pass-through circuit 602, an attenuator circuit 802, a number of spring clips 604, 606, 608, 610, 812, 814, and a number of conductive pads 620, 622, 626, 628, 816, 818 are mounted on the substrate 104. FIGS. 6–9 illustrate these elements in greater detail. FIGS. 8 and 9 illustrate the elements which are mounted to the top face 800 of the substrate 104, and FIGS. 6 and 7 illustrate the elements which are mounted to the bottom face 600 of the substrate 104.

For ease of understanding, the elements which are mounted to the bottom face 600 of the substrate 104 will be described first. A first of the elements is a pair of conductors 612, 614. Each of these conductors 612, 614 is preferably formed as a stripline or micro-strip which is electrically coupled between one of the relay's signal terminals 124, 126, and one of a pair of conductive vias 616, 618 which extends through to the top surface 800 of the substrate 104. Another element which is mounted to the bottom surface 600 of the substrate 104 is the pass-through circuit 602. The pass-through circuit 602 is also preferably formed as a stripline or micro-strip. Each end of the pass-through circuit 602 terminates in a pad 620, 622 to which a spring clip 604, 606 is welded. Each spring clip 604, 606 is positioned and biased so as to make electrical contact with a conductor 612, 614 which is coupled to one of the relay's signal terminals 124, 126. Each spring clip 604, 606 is also positioned so that it passes under one of the holes 804, 806 through which the first pair of actuator arms 502, 504 pass. In this manner, movement of the armature assembly 102 to its second position causes the first pair of actuator arms 502, 504 to break the connections between the pass-through circuit spring clips 604, 606 and the relay's signal terminals 124, 126.

The pass-through circuit 602 and conductors 612, 614 are preferably formed as striplines or micro-strips so that each behaves as a transmission line. To this end, most of the substrate's bottom surface 600 is covered by a ground plane 624 which is coupled to the ground post 134. Narrow gaps 634, 636, 638 separate the ground plane from the pass-through circuit 602 and other conductors 612, 614 which are applied to the bottom surface 600 of the substrate 104. The ground plane 624 is preferably formed of gold.

The ground plane 624 comprises two weld areas 626, 628 to which two additional spring clips 608, 610 are coupled. These two additional spring clips 608, 610 are positioned and biased so as to make contact with a second pair of conductive vias 630, 632 which extend through to the top surface 800 of the substrate 104. The second pair of conductive vias 630, 632 are coupled to the attenuator circuit 802. The additional spring clips 608, 610 which are mounted to the underside 600 of the substrate 104 therefore serve to ground the attenuator circuit 802 when the armature assembly 102 is in its first position. Note that the additional spring clips 608, 610 are positioned so that they pass under the holes 808, 810 through which the second pair of actuator arms 506, 508 extend. In this manner, movement of the armature assembly 102 to its second position causes the second pair of actuator arms 506, 508 to break the connections between the attenuator circuit 802 and the additional spring clips 608, 610 (which connections would otherwise ground the attenuator circuit 802).

The pass-through circuit 602 and conductors 612, 614 referenced in the preceding paragraphs may be, for example, 50 ohm lines with Ni/Co/Au plated ends (e.g., hard gold>=225 knoop hardness). The spring clips 604, 606, 608, 610 may be made of, for example, BeCu, and then plated with a NiPd Au flash. The weld pads 620, 622, 626, 628 may be formed, for example, via a plating process using NiPd with a Au flash, or hard Au (e.g., Ni/Co/Au≧225 knoop hardness). The pass-through circuit 602, conductors 612, 614 and pads 620, 622, 626, 628 which are mounted to the substrate 104 may be mounted by gluing, masking, and/or other means (e.g., etching or plating).

It is generally preferred that the electrical lengths of corresponding contacts in contact pairs be equal, and that spring clip and pad sizes be kept at a minimum to reduce or eliminate problems associated with signal reflection. It is also preferable that conductor stubs be kept to minimum (e.g., when coupling a circuit between the relay's signal terminals 124, 126 and/or when coupling an inactive circuit to ground). In this manner, conductor stubs will not behave as RF antennas.

As previously mentioned, the attenuator circuit 802 is mounted to the top surface 800 of the substrate 104. Also mounted to the top surface of the substrate is a pair of welding pads 816, 818. First ends of the welding pads 816, 818 are electrically coupled to the conductive vias 616, 618 which pass through the substrate 104 and connect to the conductors 612, 614 which contact the relay's signal terminals 124, 126. Second ends of the welding pads 816, 818 provide a place to weld a third pair of spring clips 812, 814. This third pair of spring clips 812, 814 is biased to a disconnect state, with each spring clip 812, 814 being positioned over one end of the attenuator circuit 802. When the armature assembly 102 is moved to its second position, the third pair of actuator arms 510, 512 on the armature assembly 102 press the third pair of spring clips 812, 814 against their corresponding contact pads of the attenuator circuit 802, thereby causing the attenuator circuit 802 to be coupled between the relay's signal terminals 124, 126.

Preferably, the top surface 800 of the substrate 104 also comprises a ground plane 820. The ground plane preferably covers most of the top surface 800 and is coupled to the ground post 134.

Figure 10:
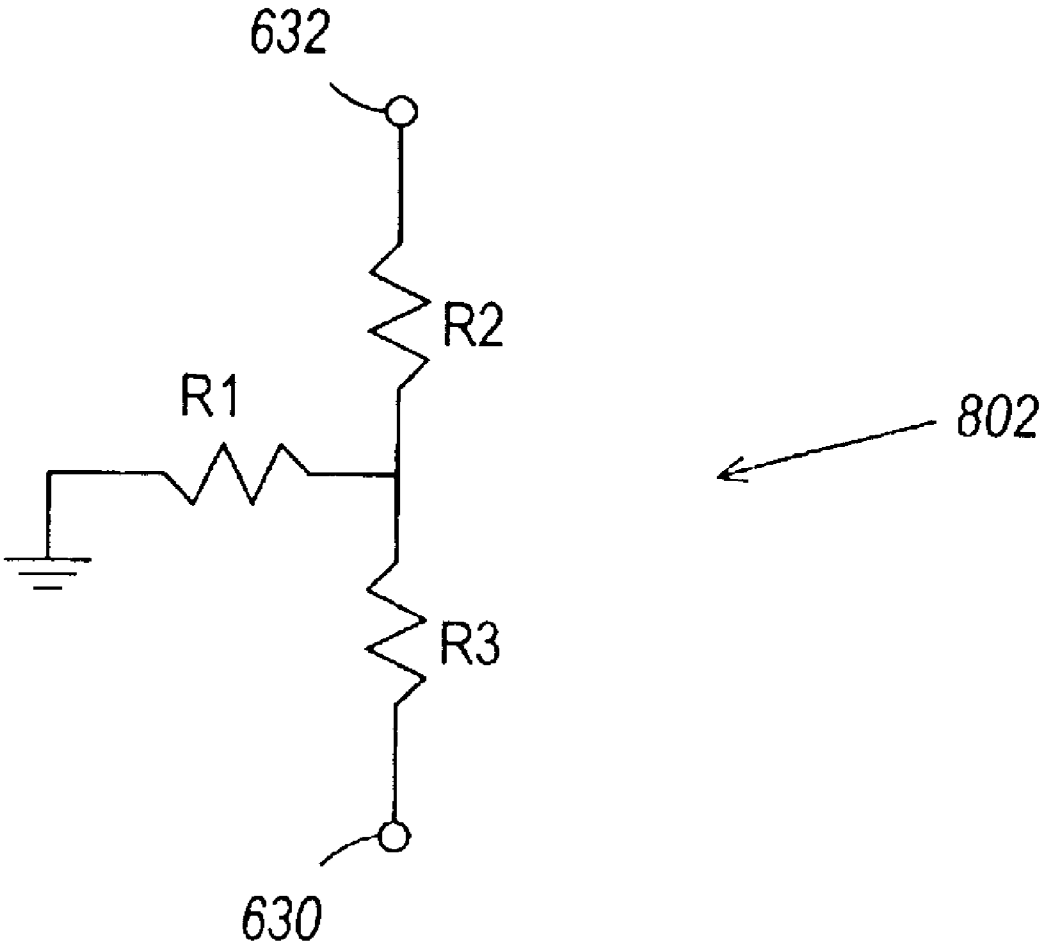
FIG. 10 is an exemplary schematic of the attenuator circuit illustrated in FIGS. 8 & 9.

The attenuator circuit 802 may assume any of a number of configurations (e.g., a "T" network, a "Π" network, or an "L" network). Precise values and types of components which form a part of the attenuator circuit are beyond the scope of this disclosure, and may be chosen to suit a particular application. However, an exemplary attenuator circuit configuration is illustrated in FIG. 10. Note that the exemplary configuration is a "Π" configuration comprising resistors R1, R2 and R3. The attenuator circuit 802 may comprise either a lumped resistance network or distributed resistance network, as application merit. However, a distributed resistance is preferred in that it provides a better field distribution and results in smaller signal reflections.

For better RF performance, the propagation delays through the relay's alternate circuit paths 602, 802 should be equal. Therefore, it is generally preferred that 1) the electrical length of the circuit comprising the pass-through circuit 602 (including associated spring clips 604, 606 and weld pads 620, 622), and 2) the electrical length of the circuit comprising the attenuator circuit 802 (including associated vias 616, 618, weld pads 816, 818, and spring clips 812, 814), be equal, although such is not required. Also, equal length circuit paths makes it easier to place the relay 100 in a circuit design.

One advantage of the relay 100 shown in FIG. 1 is that by mounting the pass-through and attenuator circuits 602, 802 on different faces 600, 800 of the substrate 104 (e.g., opposite faces), the insulating nature of the substrate 104 helps to keep interference between the two circuits 602, 802 below a manageable level. A problem with past relays having two circuit paths is that the unused circuit tended to act as an antenna for noise, which noise was then imparted to the circuit path which was in use. The FIG. 1 relay 100 eliminates or at least significantly reduces this phenomenon.

Another advantage of a relay 100 such as that which is shown in FIG. 1 is that grounding the pass-through and attenuator circuits 602, 802 while they are not in use further helps to reduce the noise which the unused circuit can transfer to the circuit which is in use. If the ground planes are the same voltage potential, the RF signal should see>100 dB isolation, and operation of the relay 100 should be effective up to 5–7 GHz. Effective grounding also helps to maintain a uniform characteristic impedance of all conductors 602, 612, 614, 802, 616, 618 which are mounted on the substrate 104. To improve grounding even more, conductive vias joining the ground planes 624, 820 on the substrate's top and bottom surfaces 600, 800 may be placed at various points throughout the substrate 104. The edges of the substrate 104 may also be metallized so as to join the two ground planes 624, 820 and improve the uniformity of the ground.

3. A Second Relay Embodiment

FIG. 11 illustrates a second embodiment of a relay 1100. Like the first relay 100, the second relay 1100 is housed within a metallic structure comprising a base plate 120 and a cover 122. Protruding through the base plate 120 are signal and control terminals 124/126, 128/130, each pair of which is insulated from the metallic base plate 120. The signal terminals 124, 126 are alternately coupled to one another via one of two circuits 1402 (FIG. 14), 1502 (FIG. 15) which are housed within the relay 1100. The control terminals 128, 130 are provided for the purpose of controlling an electro-magnetic actuator assembly 106–112 which is housed within the relay 1100. The presence of a voltage on the control terminals 128, 130 determines the state of the electro-magnetic actuator assembly 106–112, which in turn determines which of the two circuits 1402, 1502 mounted within the relay 1100 will be connected between the signal terminals 124, 126.

A header 132 is mounted within the relay housing 120, 122 on top of the base plate 120. The header 132 serves to give the relay 100 more rigidity, and is preferably formed of a metallic material which is grounded to the relay housing 120, 122. By way of example, the header 132 may comprise gold plated Kovar.

The signal and control terminals 124–130 are insulated from the header 132 and protrude through the header 132 into the interior of the relay housing 120, 122. Four ground posts 1112, 1114, 1116, 134 are preferably welded to the header 132 and protrude into the interior of the relay housing 120, 122. A substrate 1104 (and preferably a lapped alumina ceramic substrate) is suspended above the header 132. Preferably, the substrate 1104 is suspended above the header 132 by attaching it to the upper portions of three of the ground posts 1112–1116.

A pass-through circuit 1402 is mounted to the bottom face 1400 of the substrate 1104, and an attenuator circuit 1502 is mounted to the top face 1500 of the substrate 1104. See FIGS. 14 and 15.

Figure 12:
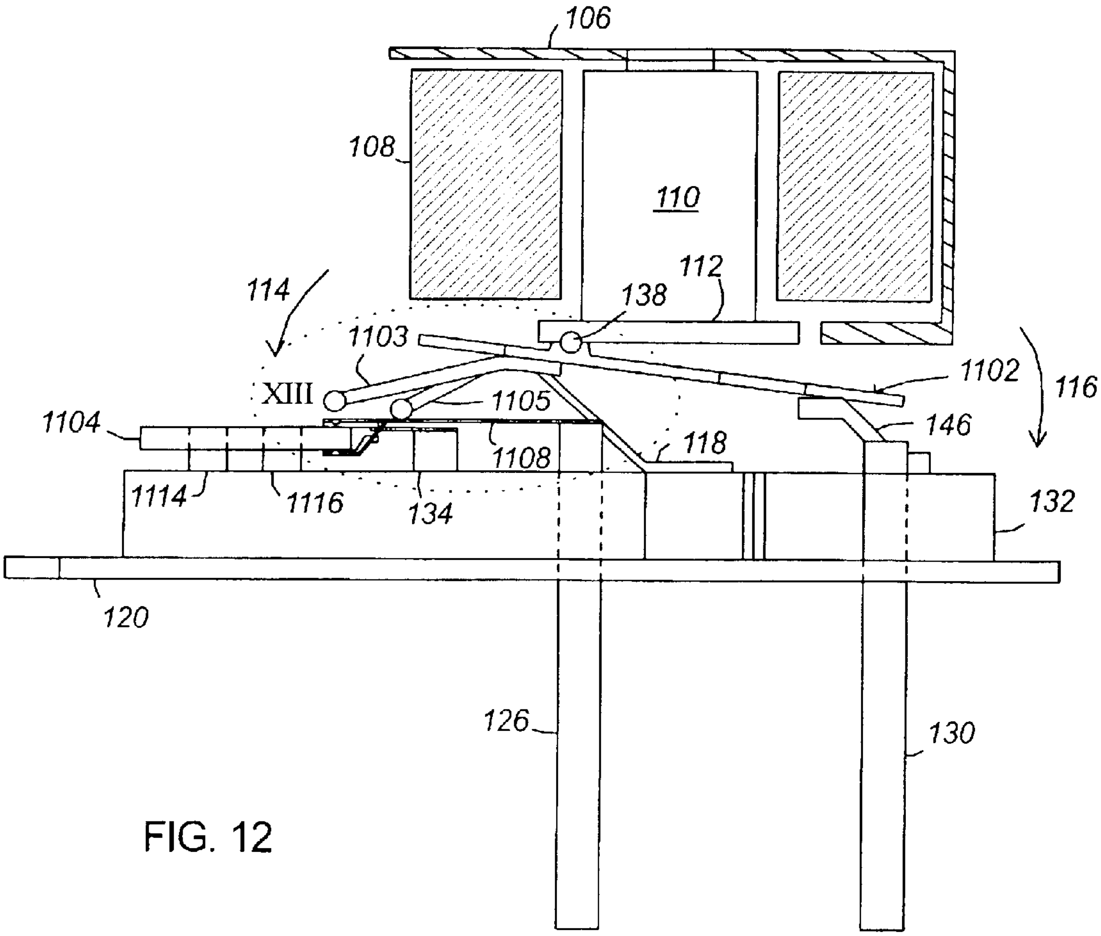
FIG. 12 is an elevational view of the internal components of the FIG. 11 relay.

The electro-magnetic actuator assembly 106–112 which is mounted within the relay housing 120, 122 comprises two magnetic poles 106, 112, a coil 108, and a core 110. The coil 108 is slipped over the core 110, and the core 110 and coil 108 are then mounted between the two magnetic poles 106, 112. The first magnetic pole 106 is then used to mount the electro-magnetic actuator assembly 106–112 to the header 132 such that the second magnetic pole 112 is suspended over the header 132 in back of the afore-mentioned substrate 1104 (which is also suspended over the header 132). The two ends 107, 109 of the coil 108 are respectively and electrically coupled to the relay's control terminals 128, 130. When a voltage is applied to the control terminals 128, 130, current flows through the coil 108 and an electromagnetic force flows through the core 110. The electromagnetic force in turn polarizes the two magnetic poles 106, 112 and causes the lower portion of the first magnetic pole 106 to exert an attractive magnetic force on one end of an armature assembly 1102. See FIG. 12.

The armature assembly 1102 comprises a main body 148 and number of actuator arms 1101, 1103, 1105. The main body is an essentially flat metallic structure to which the number of actuator arms 1101, 1103, 1105 and two pivot pins 138, 140 are attached. The actuator arms 1101, 1103, 1105 are preferably formed of a strong, non-conductive material such as plastic. The pivot pins 138, 140 fit in indents 142, 144, holes or crevices formed in the underside of the second magnetic pole 112. A biasing spring 118 which is mounted on the header 132 applies pressure to the underside of the armature assembly 1102 so that the armature assembly 1102 assumes its first position when the electro-magnetic actuator assembly 106–112 is not energized. A stop 146 mounted on the header 132 prevents the spring 118 from over-biasing the armature assembly 1102.

Figure 13:
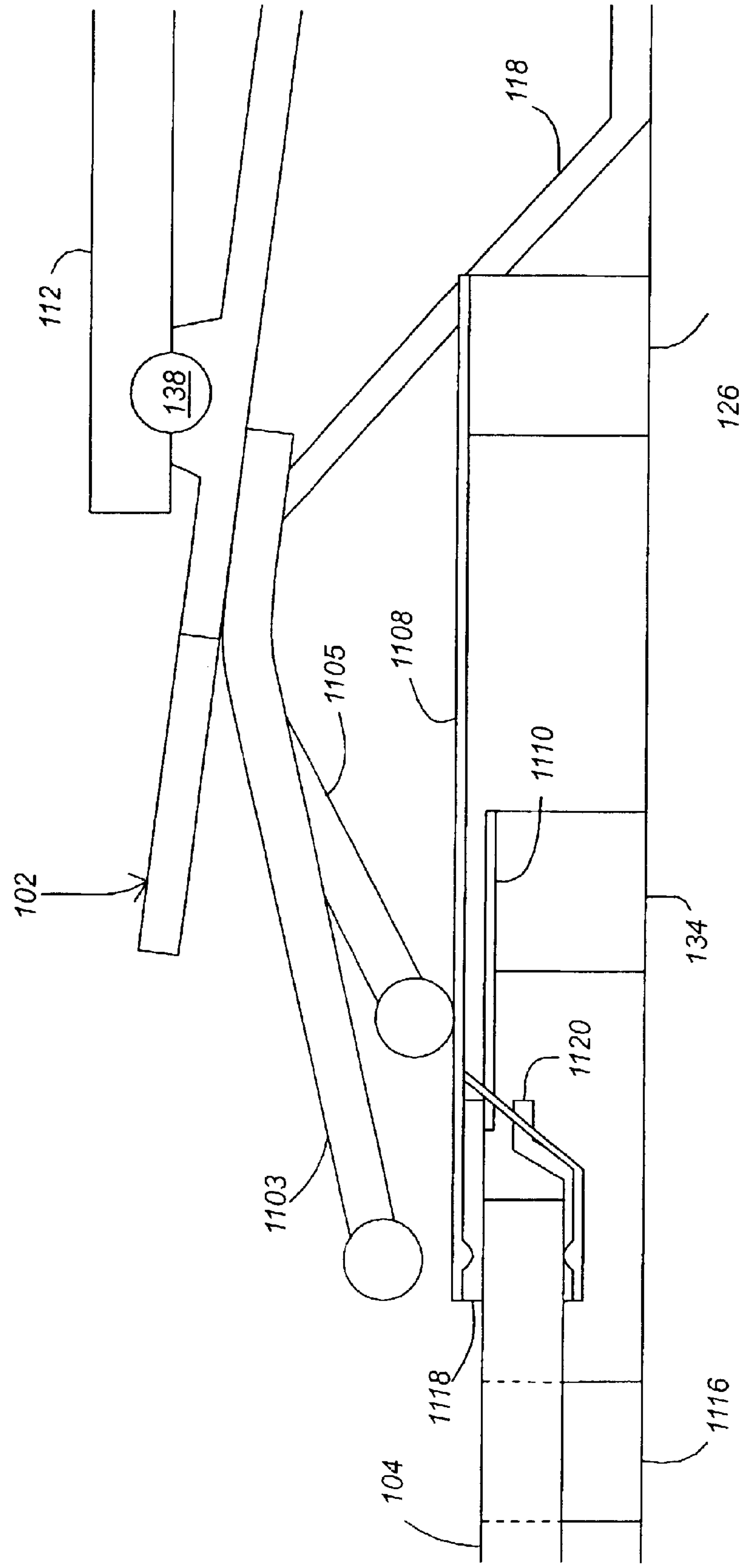
FIG. 13 is an enlarged view of a portion of FIG. 12.

Two of the actuator arms 1101, 1103 which extend from the armature assembly 1102 are positioned over biased leaf springs 1106, 1108 which are respectively and electrically coupled to the relay's signal terminals 124, 126 (see especially FIG. 13). The ends of the leaf springs 1106, 1108 which are not coupled to the signal terminals 124, 126 are bifurcated such that a contact on each leaf spring is provided above the substrate 1104. The leaf springs 1106, 1108 are biased so that the lower contacts of each leaf spring 1106, 1108 make contact with ends 1404, 1406 (FIG. 14) of the pass-through circuit 1402 which is mounted to the underside 1400 of the substrate 1104. Thus, when the armature assembly 1102 is in its first position, current flows through the pass-through circuit 1402. When the armature assembly 1102 moves to its second position, a pair of actuator arms 1101, 1103 on the armature assembly 1102 press the leaf springs 1106, 1108 downward so that the upper contacts of the leaf springs 1106, 1108 make contact with ends 1504, 1506 (FIG. 15) of the attenuator circuit 1502 which is mounted on top 1500 of the substrate 1104. As a result, movement of the armature assembly 1102 to its second position causes current to flow through the attenuator circuit 1502.

The armature assembly 1102 may also comprise a third actuator arm 1105 for alternately grounding the pass-through and attenuator circuits 1402, 1502 when they are not being used. As shown in FIG. 13, a grounding member 1118, 1120 may extend from each of the pass-through and attenuator circuits 1402, 1502 such that it overhangs one edge of the substrate 1104. A leaf spring 1110 which is electrically coupled to a grounding post 134 is then mounted such that it may alternately make contact with one or the other of the grounding members 1118, 1120. For example, if the leaf spring 1110 is biased to contact the grounding member 1118 attached to the attenuator circuit 1502 when the armature assembly 1102 is at rest, then movement of the armature assembly 1102 to its second position can 1) cause the leaf spring 1110 to break its contact with the grounding member 1118 which is coupled to the attenuator circuit 1502, and 2) alternately ground the pass-through circuit 1402 (i.e., via contact between the leaf spring 1110 and the pass-through circuit's ground member 1120).

As in the first relay 100, the attenuator circuit 1502 may assume any of a number of configurations (e.g., a "T" network, a "II" network, or an "L" network), and precise values and types of components which form a part of the attenuator circuit 1502 are beyond the scope of this disclosure.

4. Alternate Relay Embodiments

The relays disclosed in FIGS. 1 and 11 may be alternately embodied and constructed, without departing from the principles disclosed herein.

For example, each of their armature assemblies 102, 1102 may comprise more or fewer actuator arms 502–512, 1101,

1103, 1105. As is known in the art, a circuit needs only one break to prevent current flow therethrough. Each pair of actuator arms 502/504, 506/508, 510/512, 1101/1103 discussed above may therefore be replaced with a single actuator arm. However, noise reduction may be greatly improved by wholly decoupling an unused circuit from a relay's signal terminals 124, 126 when the circuit is not in use. Furthermore, the grounding of a circuit as shown and described is not possible when a circuit is only disconnected from one or the other of a relay's signal terminals 124, 126.

As previously mentioned, an armature assembly 102, 1102 need not move in a pivotal fashion, and could alternately move in a translational fashion.

An alternate embodiment of the electro-mechanical relay that is not shown may include an armature assembly wherein circuit paths are routed over (or through) the armature assembly itself. Thus, in lieu of an armature assembly comprising actuator arms which press on contacts, contacts and circuit paths could be formed directly on an armature assembly.

Also, the first and second circuits 602/802, 1402/1502 of each relay 100, 1100 need not be mounted on opposite faces 600/800, 1400/1500 of a substrate 104, 1104. For example, first and second circuits could alternately be mounted to adjacent faces of a wedge-shaped substrate.

Furthermore, the first and second circuits need not be pass-through and attenuator circuits. Any combination of two circuits which one might alternately desire to couple into a circuit path could benefit from the principles disclosed herein.

To maintain good characteristic impedance and effective isolation between pass-through and attenuator circuits 602/802, 1402/1502, it is generally preferred, but not required, that either the pass-through or attenuator circuit be grounded when it is not in use. However, such a grounding is not required.

While preferred materials of construction have been disclosed in some instances, a variety of insulating and conductive materials may be used to form the various components of the relays illustrated in FIGS. 1 and 11.

While illustrative and presently preferred embodiments of the invention have been described in detail herein, it is to be understood that the inventive concepts may be variously embodied and employed, and that the appended claims are intended to be construed to include such variations, except as limited by the prior art.

What is claimed is:

1. A method of constructing a relay which is designed to alternately allow current flow through first and second circuits, comprising:

a) mounting the first circuit on a first face of a substrate;

b) mounting the second circuit on a second face of the substrate;

c) providing an armature assembly which is movable between first and second positions with respect to the substrate; and d) providing at least one biased conductor for closing the first circuit and at least one biased conductor for closing the second circuit, wherein movement of the armature assembly causes movement of the biased conductors to thereby alternately allow current flow through the first and second circuits.

2. A method as in claim 1, further comprising providing a means for grounding the second circuit when the armature assembly is moved to its first position.

3. A method as in claim 2, further comprising providing a means for grounding the first circuit when the armature assembly is moved to its second position.

4. A method as in claim 1, further comprising providing the armature assembly with at least one actuator arm, wherein the at least one actuator arm extends through the substrate and presses on one or more of the biased conductors when the armature assembly is moved to its second position.

5. A method as in claim 1, further comprising:

a) constructing the first circuit as a pass-through circuit; and b) constructing the second circuit as an attenuator circuit.

* * * * *